United States Patent [19]
Badger

[11] 3,990,013
[45] Nov. 2, 1976

[54] TELEVISION TUNING SYSTEM INCLUDING A TUNER WITH AN INSULATED SHAFT COUPLING

[75] Inventor: Joe G. Badger, Bloomington, Ind.

[73] Assignee: Sarkes Tarzian, Inc., Bloomington, Ind.

[22] Filed: Dec. 23, 1974

[21] Appl. No.: 535,223

[52] U.S. Cl. .............................. 325/464; 74/10 R; 74/548; 174/5 R; 174/46; 174/138 D; 200/334; 334/89; 403/298; 403/359
[51] Int. Cl.² ...................... H03J 1/00; F16C 3/00; G05G 25/00; B25G 1/12
[58] Field of Search ............ 174/5 R, 46, 85, 138 R, 174/138 D, 5, 138; 325/496, 464; 403/24, 203, 225, 243, 286, 292, 298, 359, 361, 365, 367, 368, 371, 372, 377, 404, 369; 16/116 R, DIG. 30, DIG. 41; 52/726, 753 E; 64/1 R, 1 S; 334/89; 74/10, 504, 543, 544, 548, 553, 10 R; 200/334; 285/48, 53

[56] References Cited
UNITED STATES PATENTS

| | | | |
|---|---|---|---|
| 1,743,492 | 1/1930 | Sipe | 52/753 E UX |
| 2,358,737 | 9/1944 | Schwinn | 403/203 |
| 2,604,583 | 7/1952 | Torre | 174/46 X |
| 2,679,911 | 6/1954 | Bhend | 52/726 X |
| 2,681,378 | 6/1954 | Skwarek | 174/138 D |
| 2,949,304 | 8/1960 | Williams | 403/359 X |
| 3,218,097 | 11/1965 | Bowers et al. | 403/295 |

FOREIGN PATENTS OR APPLICATIONS

| | | | |
|---|---|---|---|
| 683,414 | 3/1964 | Canada | 174/85 |

Primary Examiner—Laramie E. Askin
Attorney, Agent, or Firm—Mason, Kolehmainen, Rathburn & Wyss

[57] ABSTRACT

An insulated coupling usable with a television tuner shaft or the like for electrically isolating the tuner shaft from the chassis of the television receiver includes a pair of flanged insulating bushings pressed into axially extending chambers formed in the ends of two coupled sections of the tuner shaft. A knurled pin fabricated from hardened steel or other strong material is pressed into the two bushings to hold the two sections of the shaft together with the two flanges of the bushings abutting to form an insulated section between the two coupled sections of the shaft.

13 Claims, 6 Drawing Figures

U.S. Patent  Nov. 2, 1976  3,990,013
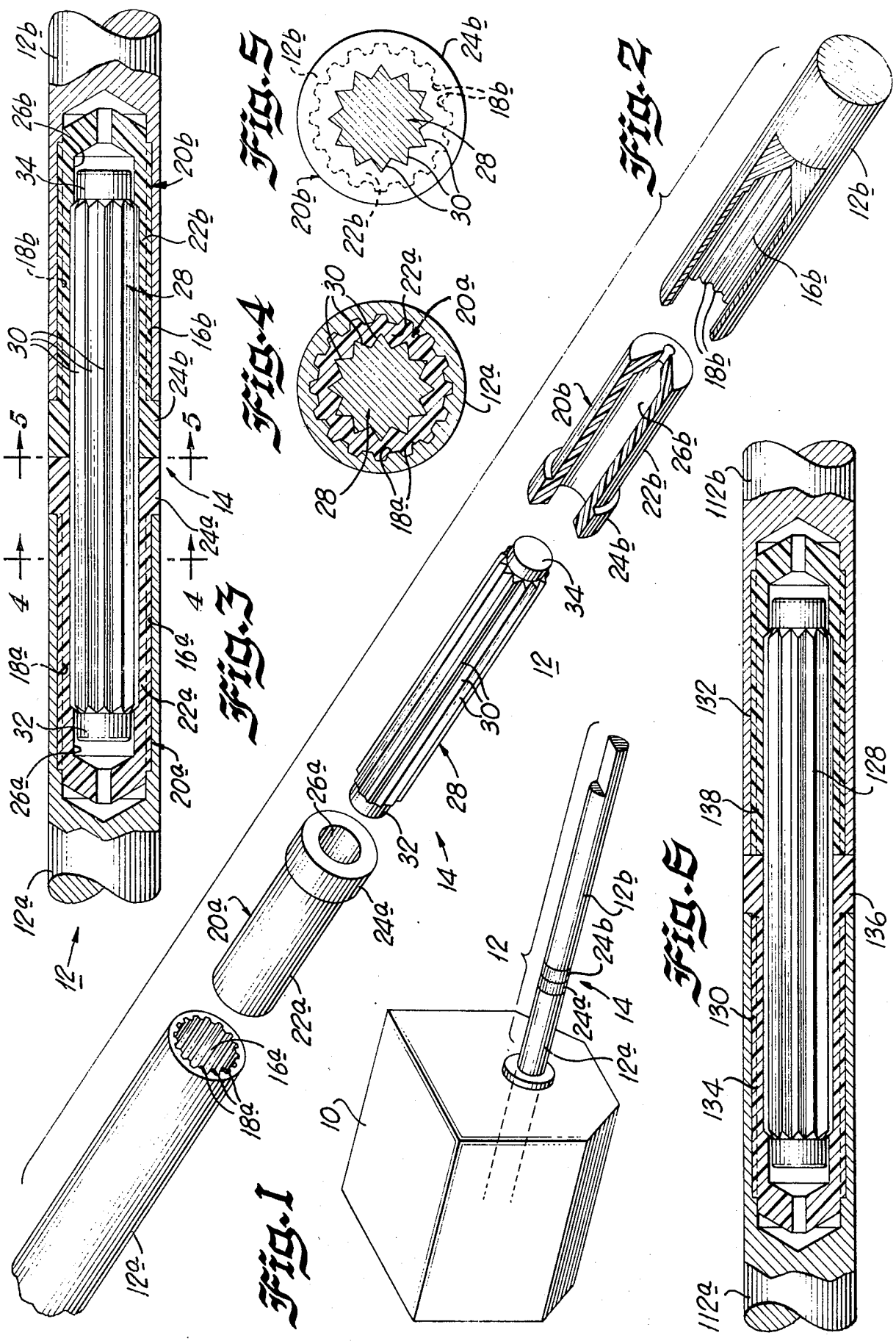

TELEVISION TUNING SYSTEM INCLUDING A TUNER WITH AN INSULATED SHAFT COUPLING

BACKGROUND OF THE INVENTION

This invention relates generally to couplings and, more particularly, to an improved insulated coupling for a television tuner shaft or the like.

Several techniques for providing an insulated shaft coupling are known. The most common technique utilizes a two section metal shaft having an axially extending chamber formed in the end of one of the sections and an axially extending reduced diameter section formed in the other section. An insulating bushing is inserted into the chamber, and the reduced diameter portion of the other metal section is pressed into the bushing which serves to hold the two sections together with a press fit.

Although this system provides a way to insulate two sections of a metal shaft, the system necessitates a compromise between the insulating qualities and the mechanical strength of the coupling. For example, when such a prior art system is employed in a television tuner shaft having a nominal 0.250 inch diameter, the reduced diameter section of the mating section must be reduced to approximately 0.150 inch to permit the walls of the insulating bushing to be sufficiently thick to provide the necessary insulating properties. Unfortunately, reducing the diameter of the shaft within the coupling reduces the mechanical strength of the shaft and results in bending and breakage problems occurring at the coupling, particularly with long shafts of the type commonly used in console television sets.

SUMMARY OF THE INVENTION

Accordingly, it is an object of the present invention to provide an improved insulated coupling.

It is another object of the present invention to provide an insulated shaft coupling that has greater mechanical strength and better insulating properties than prior art shafts.

In accordance with a preferred embodiment of the invention, an axially extending chamber is formed in one end of each of the two metal shaft sections to be joined. A flanged insulating bushing is pressed into each of the chambers and a hardened steel pin is pressed into the two insulating bushings in order to hold the two sections of the shaft together with the flanges of the insulating bushings abutting each other. Because of the above structure provides a doubly insulated coupling, with insulation isolating the pin from both of the shaft sections, the thickness of the walls of the two bushings may be reduced to permit a larger diameter pin to be used to increase mechanical strength without sacrificing the insulating properties of the coupling. Furthermore, the pin may be fabricated from hardened steel or the like, which is substantially stronger than the shaft material, to further increase the mechanical strength of the coupling or to permit a smaller diameter pin to be used to further improve the insulating properties of the coupling without sacrificing mechanical strength.

The above and other objects and advantages of the present invention will be readily apparent from the following detailed description and attached drawing, wherein:

FIG. 1 is a simplified perspective view of a television tuner utilizing the insulated coupling according to the invention;

FIG. 2 is an exploded perspective view of the insulated coupling according to the invention;

FIG. 3 is a side sectional view of the insulated coupling according to the invention;

FIG. 4 is a cross sectional end view of the insulated coupling taken along the line 4—4 of FIG. 3;

FIG. 5 is a cross sectional end view taken along line 5—5 of FIG. 3; and

FIG. 6 is a cross sectional side view of an alternative embodiment of the insulated coupling according to the invention.

DETAILED DESCRIPTION OF THE INVENTION

Referring now to the drawing, with particular reference to FIG. 1, there is shown a television tuner 10 having a selector shaft 12 protruding therefrom. The selector shaft 12 comprises a first section 12a extending outwardly from the tuner 10 and a second section 12b coupled to the section 12a by means of an insulated coupling 14. The insulated coupling 14 serves to isolate the tuner 10 from the shaft section 12b to protect the user from electrical shock in the event that the tuner is used in conjunction with a live chassis receiver and the power plug is inserted such that the potential of the chassis is at line potential.

The shaft sections 12a and 12b (FIGS. 2–5) are fabricated from standard tuner shaft stock, and are typically 0.250 inch in diameter. Splined chambers 16a and 16b are formed in one end of each of the respective shaft sections 12a and 12b. The splined chambers 16a and 16b are typically formed, for example, by drilling an axial hole to a depth of 0.625 inch and forming a 16-point internal spline 18a and 18b in each of the respective chambers 16a and 16b.

Two bushings 20a and 20b are fabricated from an insulating material such as nylon. Each of the bushings 20a and 20b has a respective body portion 22a and 22b, and a respective flange portion 24a and 24b. The outside diameters of the body portions 22a and 22b are selected to provide a press fit with the respective chambers 16a and 16b. The outside diameters of the flanges 24a and 24b are substantially equal to the outside diameter of the shaft sections 12a and 12b. The diameter of the flanges 24a and 24b may be smaller than the diameter of the shaft sections 12a and 12b, but preferably not larger, as this may prevent the shaft from being fully inserted into relatively small holes of the type found in control knobs, mounting brackets, etc. Axial openings 26a and 26b are formed in each of the respective bushings 20a and 20b for receiving a knurled coupling pin 28 which may be fabricated from any strong material such as hardened carbon steel.

The pin 28 has a knurled section 30 and a pair of reduced diameter end sections 32 and 34. The pin in the illustrated embodiment has a 12-point knurl, but any number of points, consistent with good design practice, may be used. The outside diameters of the reduced diameter end sections are smaller than the inside diameters of the openings 26a and 26b, and serve to center the pin 28 in the bushings 20a and 20b during assembly. The outside diameter of the knurled section 30 is larger than the inside diameter of the openings 26a and 26b and provides a press fit between the pin 28 and the bushings 20a and 20b. As shown in FIG. 4, the bushing 20a (and similarly the bushing 20b) is deformed by the spline 18a and the knurled section 30 so that the outside of body 22a conforms to the shape of the spline 18a and the axial opening 26a is deformed to correspond to the shape of the knurled section 30 of the pin 28. Such a deformation causes an extremely tight coupling between the pin 28 and the two shaft sections 12a and 12b. Spaces between the bottom of the shaft chambers 16a and 16b and the ends of the respective bushings 20a and 20b have been shown in the drawings, but it is desirable to minimize these spaces or to provide protrusions at the ends of the bushings 20a and 20b to prevent the bushings 20a and 20b from being excessively stretched when the pin 28 is inserted. In addition, the spaces between the ends of the pin 28 and the bottoms of the bushings 20a and 20b should be minimized to prevent the pin 28 from being inserted substantially deeper into one of the bushings 20a and 20b than the other.

In the embodiment described above, the two flanges 24a and 24b serve to separate the ends of the shaft sections 12a and 12b to prevent the two shaft sections 12a and 12b from physically contacting each other. The body portions 22a and 22b serve to insulate the shaft section 12a from the pin 28 and the pin 28 from the shaft section 12b, thereby providing two insulating members connected electrically in series and permitting thinner walls to be used for the body portions 22a and 22b to provide a stronger structure without sacrificing electrical isolation. In this embodiment, each of the bushings 20a and 20b is provided with a flange so that identical bushings may be used as the bushings 20a and 20b, thereby reducing the number of different parts required. However, it is not necessary to make the structure symmetrical, and only one of the bushings need to be provided with a flange, provided the flange is sufficiently thick (in the axial direction) to prevent electrical arcing between the two shaft sections 12a and 12b. Such an embodiment is shown in FIG. 6.

In the embodiment shown in FIG. 6, two shaft sections 112a and 112b, analogous to the shaft sections 12a and 12b, are joined by pin 128. Instead of using two symmetrical bushings, such as the bushings 20a and 20b described in the previous embodiment, insulation is provided by utilizing a flanged bushing 130 and an unflanged bushing 132. The flanged bushing 130 is similar to the bushings 20a and 20b and has a body portion 134 and a flange portion 136. If necessary, the flange portion 136 may be made thicker (i.e. having an increased longitudinal dimension) than the flange portions 24a and 24b to provide the desired isolation. The bushing 132 has a body portion 138 similar to the body portions 22a and 22b, but no flange portion. As in the case of the previous embodiment, the diameters of the pin 128 and the bushings 130 and 132 are selected to provide a press fit between the pin 128 and the bushings 130 and 132, and between the bushings 130 and 132 and the shaft sections 112a and 112b.

In another embodiment (not illustrated), two flangeless bushings similar to the bushing 132 may be used, and an insulating washer may be used in place of the flange 136 to separate the two shaft sections. Alternatively, the coupling pin may be encapsulated in an insulating material, and a washer (either separate or integrally formed with the encapsulation) may be used to keep the two shaft sections separated.

While certain preferred embodiments of the invention have been described by way of illustration, many modifications will occur to those skilled in the art; it will be understood, of course, that it is not desired that the invention be limited thereto, since modifications may be made, and it is, therefore, comtemplated by the appended claims to cover any such modifications as fall within the true scope and spirit of the invention.

What is claimed as new and desired to be secured by Letters Patent of the United States is:

1. A television tuning system of the type employing an insulated shaft coupling comprising:
    a television tuner;
    first and second rigid shaft sections, each having an axially extending chamber formed in one end thereof, said first shaft section extending into said tuner;
    an elongated rigid pin member; and
    means for electrically insulating said first and second shaft sections from each other surrounding at least a portion of said pin member, said insulating means being interposed between said pin member and each of said first and second shaft sections and electrically insulating said pin member from each of said shaft sections, said insulating means also having a surface frictionally engaging said first and second shaft sections and rigidly mechanically coupling said first and second shaft sections together to permit said tuner to be tuned by rotating said second shaft section, said insulating means serving to transmit rotational motion from said second shaft section to said first shaft section.

2. A television tuning system as recited in claim 1 wherein said surface is an outside surface frictionally engaging said first and second shaft sections within said respective chambers.

3. A television tuning system as recited in claim 2 wherein said insulating means further includes an enlarged central area separating said first and second shaft sections and dividing said outside surface into a pair of surfaces disposed at opposing ends of said insulating means.

4. A television tuning system as recited in claim 3 wherein said pair of and said central area each have a substantially circular cross section.

5. A television tuning system as recited in claim 2 wherein each of said chambers includes a plurality of axially extending splines.

6. A television tuning system as recited in claim 5 wherein at least a portion of said pin member is knurled.

7. A television tuning system of the type employing an insulated shaft coupling comprising:
    a television tuner;
    first and second rigid shaft sections, each having an axially extending chamber formed in one end thereof, said first shaft section extending into said tuner;
    first and second cylindrical insulating members, each being frictionally retained within one of said chambers; and
    an elongated rigid pin member engaging said first and second cylindrical isulating members and rigidly mechanically coupling said first and second shaft sections together, said first and second cylindrical insulating members electrically insulating said first and second shaft members from each other and from said pin member.

8. A television tuning system as recited in claim 7 wherein said cylindrical insulating members are fabricated from rigid material.

9. A television tuning system as recited in claim 7 wherein at least one of said insulating members has a flange member extending therefrom and interposed between said first and second shaft sections.

10. A television tuning system as recited in claim 9 wherein one of said shaft sections has a circular cross-section and said flange has a predetermined outside diameter equal to the diameter of said circular cross section shaft section.

11. A television tuning system as recited in claim 7 wherein said pin member is knurled.

12. A television systme as recited in claim 7 wherein said elongated pin member is fabricated from a stronger material than the material comprising said first and second shaft sections.

13. A television tuning system as recited in claim 7 wherein said elongated pin member is fabricated from hardened steel.

* * * * *

UNITED STATES PATENT OFFICE
CERTIFICATE OF CORRECTION

Patent No. 3,990,013            Dated November 2, 1976

Inventor(s) Joe G. Badger

It is certified that error appears in the above-identified patent and that said Letters Patent are hereby corrected as shown below:

Column 4, line 41, after "of" insert --outside surface--; and

Column 6, line 3, delete "systme" and substitute --system--.

Signed and Sealed this

First Day of March 1977

[SEAL]

Attest:

RUTH C. MASON
*Attesting Officer*

C. MARSHALL DANN
*Commissioner of Patents and Trademarks*